(12) United States Patent
Bae et al.

(10) Patent No.: US 10,002,219 B2
(45) Date of Patent: Jun. 19, 2018

(54) METHOD FOR PLACING PARALLEL MULTIPLIER

(71) Applicant: SAMSUNG ELECTRONICS CO., LTD., Suwon-si, Gyeonggi-do (KR)

(72) Inventors: Sungmin Bae, Hwaseong-si (KR); Hyung-Ock Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 46 days.

(21) Appl. No.: 15/068,931

(22) Filed: Mar. 14, 2016

(65) Prior Publication Data

US 2016/0283614 A1    Sep. 29, 2016

(30) Foreign Application Priority Data

Mar. 25, 2015    (KR) ........................ 10-2015-0041641
Aug. 21, 2015    (KR) ........................ 10-2015-0118175

(51) Int. Cl.
    *G06F 17/50*    (2006.01)
(52) U.S. Cl.
    CPC ........ *G06F 17/505* (2013.01); *G06F 17/5072* (2013.01)
(58) Field of Classification Search
    USPC ................................. 716/104, 105, 113, 118
    See application file for complete search history.

(56) References Cited

U.S. PATENT DOCUMENTS

| | | | | |
|---|---|---|---|---|
| 5,982,193 A * | 11/1999 | Agrawal | .......... | H03K 19/17744 326/39 |
| 7,085,702 B1 * | 8/2006 | Hwang | ............... | G06F 17/5045 326/93 |
| 7,698,680 B2 | 4/2010 | Kim | | |
| 8,566,761 B2 | 10/2013 | Xiang et al. | | |
| 8,621,412 B1 | 12/2013 | Vats et al. | | |
| 8,751,986 B2 | 6/2014 | Arunachalam et al. | | |
| 9,047,431 B2 | 6/2015 | Sather et al. | | |
| 2010/0318592 A1 * | 12/2010 | Han | ........................ | G06F 7/535 708/235 |
| 2013/0135008 A1 * | 5/2013 | Zhang | .................... | B82Y 10/00 326/41 |
| 2013/0326451 A1 | 12/2013 | Cho et al. | | |
| 2014/0372961 A1 * | 12/2014 | Sather | ................. | G06F 17/5054 716/113 |

* cited by examiner

*Primary Examiner* — Brian Ngo
(74) *Attorney, Agent, or Firm* — Lee & Morse, P.C.

(57) ABSTRACT

A method for placing a parallel multiplier with a placement and routing tool includes receiving a datapath netlist about the parallel multiplier, extracting locations of primary input cells and primary output cells from the datapath netlist using a structure analysis module, mapping the primary input cells and the primary output cells on a specific array using the placement and routing tool, and arranging columns of the primary input cells and the primary output cells based on physical sizes of the primary input cells. The columns are arranged using the placement and routing tool. The size of the specific array is determined according to a number of the primary input cells.

15 Claims, 9 Drawing Sheets

Non-booth | Booth

METHOD FOR PLACING PARALLEL MULTIPLIER

CROSS-REFERENCE TO RELATED APPLICATION

Korean Patent Application Nos. 10-2015-0041641, filed on Mar. 25, 2015, and 10-2015-0118175, filed on Aug. 21, 2015, and entitled: "Method for Placing Parallel Multiplier," are incorporated by reference herein in their entirety.

BACKGROUND

1. Field

One or more embodiments described herein relate to a method for placing a parallel multiplier.

2. Description of the Related Art

A System-on-Chip (SOC) may include numerous internal datapaths and logic circuits. Such an SOC may be fabricated using an automated placement and routing method. However, determining a placement algorithm which seeks to minimize wire lengths while at the same time achieve optimal power, performance, and space may be difficult to implement. This is because placement algorithms do not take into consideration architectural characteristics of the datapaths. In an attempt to cope with this kind of algorithmic problem, structural placement and routing may be performed manually. However, this approach has proven to be costly and time inefficient.

SUMMARY

In accordance with one or more embodiments, a method for placing a parallel multiplier with a placement and routing tool running on a computer includes receiving a datapath netlist about the parallel multiplier; extracting locations of primary input cells and primary output cells from the datapath netlist using a structure analysis module; mapping the primary input cells and the primary output cells on a specific array using the placement and routing tool; and arranging columns of the primary input cells and the primary output cells based on physical sizes of the primary input cells, the arranging being performed using the placement and routing tool, wherein a size of the specific array is determined according to a number of the primary input cells.

Extracting the locations of the primary input cells and the primary output cells may be performed based on a multiplicand and a multiplier provided to the parallel multiplier. The primary input cells may execute a logical operation to calculate partial products of the multiplicand and the multiplier, and the primary output cells may add the partial products to output a final product.

The method includes estimating rows to which the primary input cells belong using a multiplier provided to the parallel multiplier, and estimating columns to which the primary input cells belong using a multiplicand and the multiplier provided to the parallel multiplier. Columns to which the primary output cells belong may be determined by tracking sum outputs of compress cells connected to the primary input cells.

The specific array may include a plurality of slots, and mapping the primary input cells and the primary output cells on a specific array may include mapping the primary input cells and the primary output cells on the plurality of slots so as to have a minimum cost and a maximum flow capacity when each of the primary input cells is mapped on one of the plurality of slots. The cost may be determined based on a distance between estimated locations and practically mapped locations of the primary input cells. The flow capacity may be variable according to the plurality of the slots. The flow capacity may be proportional to a quantity of data which is transmitted from the primary input cells to the primary output cells.

The placement and routing tool may apply different weights to the cost and the flow capacity to map the primary input cells and the primary output cells on the specific array. Arranging the columns of the primary input cells and the primary output cells may include rearranging primary input cells in a first column and a second column which are adjacent to each other such that a distance between a first edge and a second edge is minimized, the first edge may be an edge of a first cell which is a most deviated in a direction of the second column, from among the primary input cells in the first column, and the second edge may be an edge of a second cell which is a most deviated in a direction of the first column, from among the primary input cells in the second column. Arranging the columns of the primary input cells and the primary output cells may include mapping an empty cell having a physical size on a slot, on which a primary input cell is not mapped, from among slots of the specific array.

In accordance with one or more other embodiments, a method for placing a parallel multiplier using a logic synthesis tool and a placement and routing tool running on a computer includes generating a datapath netlist about the parallel multiplier through the logic synthesis tool; inputting information about a structure of the parallel multiplier into the placement and routing tool; extracting locations of primary input cells and primary output cells from the datapath netlist based on a multiplicand and a multiplier provided to the parallel multiplier; mapping the primary input cells and the primary output cells on a specific array based on the information about the structure of the parallel multiplier; and arranging columns of the primary input cells and the primary output cells based on physical sizes of the primary input cells, the arranging being performed using the placement and routing tool, wherein a size of the specific array is determined according to the number of the primary input cells.

Mapping the primary input cells and the primary output cells may be performed based on a template which includes information corresponding to connection relations and a structure of the primary input cells and the primary output cells. The primary input cells may correspond to a part of logic cells of a partial product generator of the parallel multiplier, and the primary output cells may correspond to a part of logic cells of a final adder of the parallel multiplier.

In accordance with one or more other embodiments, a method for placing a logic circuit includes extracting locations of input and output cells from a datapath netlist; mapping the input cells and the output cells on an array; and arranging columns of the input cells and the output cells based on physical sizes of the input cells, wherein arranging the columns is performed using a placement and routing tool and wherein a size of the array is determined based on number of the input cells. The logic circuit may be a parallel multiplier.

Extracting the locations of the input and output cells may be performed based on a multiplicand and a multiplier provided to the parallel multiplier. The input cells may execute a logical operation to calculate partial products of the multiplicand and the multiplier, and the output cells may add the partial products to output a final product. The method may include estimating rows to which the input cells belong using a multiplier provided to the parallel multiplier, and estimating columns to which the input cells belong using a multiplicand and the multiplier provided to the parallel multiplier.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to limit the scope of the embodiments described herein. As used herein, the term "and/or" includes any and all combinations of one or more of the associated listed items. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the singular terms "a," "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. The preferred embodiment and other embodiments hereby described in detail with reference to the drawings.

Figure 1:
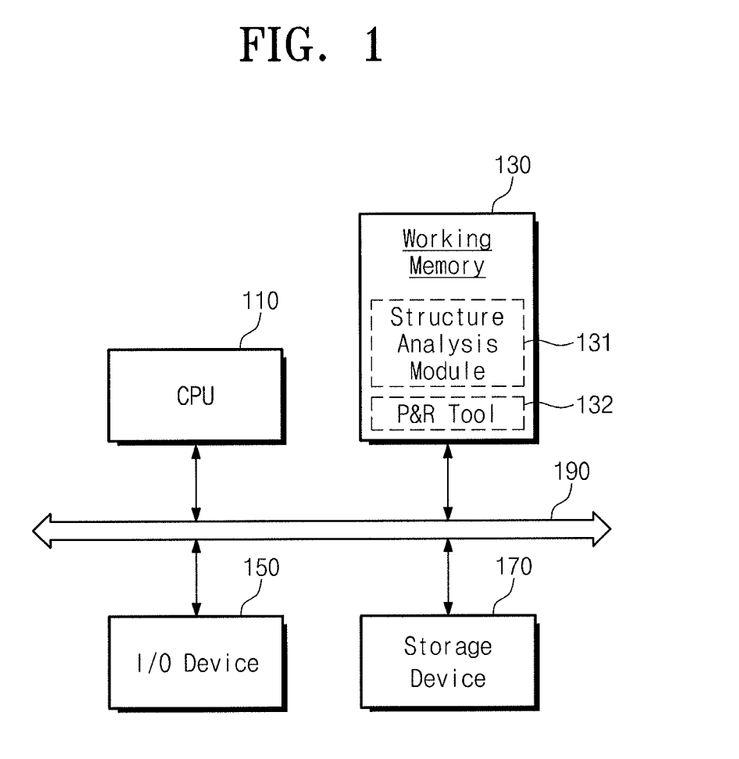
FIG. 1 illustrates an embodiment of a parallel multiplier placement system.

FIG. 1 illustrates an embodiment of a parallel multiplier placement system 100 which includes a central processing unit (CPU) 110, a working memory 130, an input/output device 150, a storage device 170, and a system bus 190. The parallel multiplier placement system 100 may be, for example, a dedicated device for placing a parallel multiplier or may be a computer for driving various placement or design tools.

The CPU 110 may run software (e.g., application programs, operating systems, and/or device drivers) for use in the parallel multiplier placement system 100. The CPU 110 may run an operating system (OS) loaded in the working memory 130. The CPU 110 may run various application programs or placement tools driven based on the OS. For example, the CPU 110 may drive datapath generation tools, structure analysis tools, and/or P&R tools loaded in the working memory 130.

A structure analysis module 131 provided as a placement tool according to one exemplary embodiment may be driven by the CPU 110. The structure analysis module 131 may extract locations and structural characteristics of logic cells of the parallel multiplier. Furthermore, the CPU 110 may drive a placement and routing (P&R) tool 132 for placing various logic cells of a chip at optimal locations.

An OS or one or more application programs may be loaded in the working memory 130. According to a booting sequence, an OS image stored in the storage device 170 may be loaded in the working memory 130 during booting of the parallel multiplier placement system 100. The OS may control input and output operations of the parallel multiplier placement system 100. Likewise, one or more application programs selected by a user or providing basic services may be loaded in the working memory 130. In one embodiment, placement tools such as the structure analysis module 131 and the placement and routing tool 132 may be loaded in the working memory 130.

The structure analysis module 131 or the placement and routing tool 132 as a placement tool may be loaded in the working memory 130 from the storage device 170. The working memory 130 may further include logic synthesis tools for generating a datapath netlist for the parallel multiplier. The working memory 130 may include a volatile memory such as a static random access memory (SRAM) or a dynamic random access memory (DRAM), or a non-volatile memory such as a phase-change RAM (PRAM), a magnetoresistive RAM (MRAM), a resistive RAM (ReRAM), a ferroelectric RAM (FRAM), or a NOR flash memory.

The structure analysis module 131 may analyze a structure of the parallel multiplier. For example, the structure analysis module 131 may receive the datapath netlist of the parallel multiplier and estimate locations of logic cells of the parallel multiplier based on the datapath netlist. The structure analysis module 131 may output structural information of the parallel multiplier, for example, in terms of physical sizes of the logic cells. The placement and routing tool 132 may place the logic cells of the parallel multiplier at optimized locations based on location and structure information of the logic cells extracted by the structure analysis module 131.

The input/output device 150 may control inputs and outputs from and to user interface devices. For example, the input/output device 150 may include input devices (e.g., keyboard, mouse, touchpad, etc.) and output devices such as a monitor or the like. The input/output device 150 may receive a template which includes structure placement information for analyzing structure of the logic cells. Structure placement information may include specific cells which guide structural placement of the logic cells and algorithm to analyze locations of the specific cells and the specific cells themselves. The input/output device 150 may display a placement procedure or placement result of the parallel multiplier placement system 100.

The storage device 170 may be provided as a storage medium of the parallel multiplier placement system 100. The storage device 170 may store application programs, an OS image, and a variety of data. Memory cards (e.g., a MultiMediaCard (MMC), an embedded MMC (eMMC), a Secure Digital (SD), a MicroSD, and the like), a hard disk drive (HDD), or a solid state drive (SSD) may be used as the storage device 170. The storage device 170 may include a NAND-type flash memory with a large storage capacity. Alternatively, the storage device 170 may include a NOR flash memory or next-generation non-volatile memories, e.g., PRAM, MRAM, ReRAM, or FRAM.

The system bus 190 may be used as an interconnector for providing a network in the parallel multiplier placement system 100. Through the system bus 190, the CPU 110, the working memory 130, the input/output device 150, and the storage device 170 may be connected electrically and may exchange data mutually. The system bus 190 may have a different configuration in another embodiment.

As described above, the parallel multiplier placement system 100 may analyze locations and structures of the logic cells based on the input datapath netlist. The parallel multiplier placement system 100 may place the logic cells of the parallel multiplier at locations (e.g., optimized or other locations) determined based on power, performance, and space in view of the analyzed locations and structure. Therefore, it may be possible to design the parallel multiplier within a short period of time and to place the parallel multiplier in logic circuitry.

Figure 2:
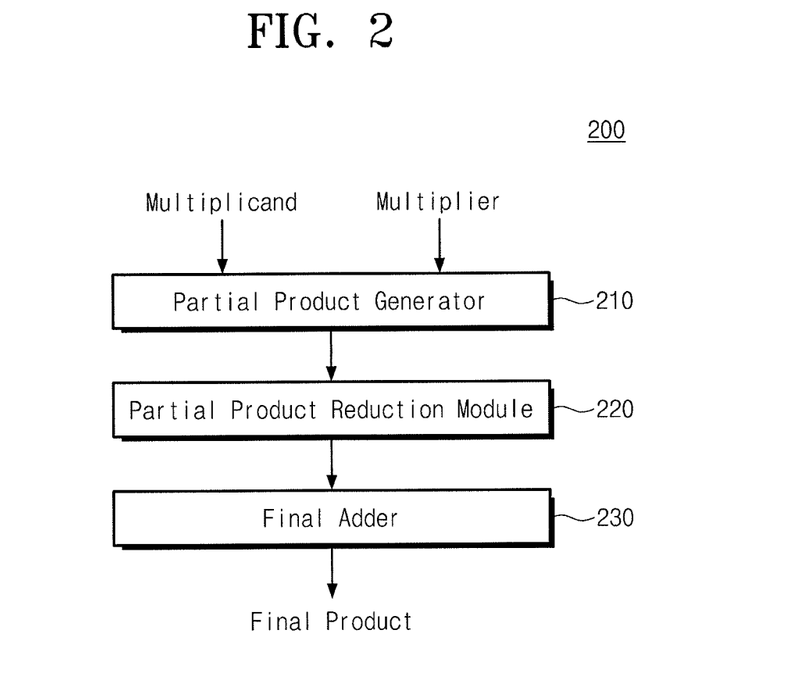
FIG. 2 illustrates an embodiment of a parallel multiplier.

FIG. 2 illustrates an embodiment of a parallel multiplier 200 placed by a parallel multiplier placement method. Referring to FIG. 2, the parallel multiplier 200 includes a partial product generator 210, a partial product reduction module 220, and a final adder 230. The parallel multiplier 200 may perform multiplication based on a multiplicand and a multiplier to output a final product. The parallel multiplier 200 may perform parallel multiplication based on the multiplicand and the multiplier.

The partial product generator 210 may generate partial products based on the multiplicand and the multiplier. For example, the partial product generator 210 may multiply an 8-bit multiplicand and an 8-bit multiplier and may generate 64 partial products as the multiplication result. Thus, in one embodiment, the partial product generator 210 may include 64 logic cells for generating 64 partial products.

The partial product reduction module 220 may accumulate the partial products and may generate sum-bits and carry-bits for generating a final product. For example, the logic cells of the partial product reduction module 220 may use a Wallace tree that receives three inputs and outputs a sum-bit and a carry-bit. The three inputs may include the sum-bit and the carry-bit from a previous row and one of the partial products from the partial product generator 210.

The final adder 230 may add sum-bits and carry-bits from the partial product reduction module 220 and may output a final product. For example, the logic cells of the final adder 230 may constitute a column with at least one of the logic cells in the partial product generator 210.

Figure 3:
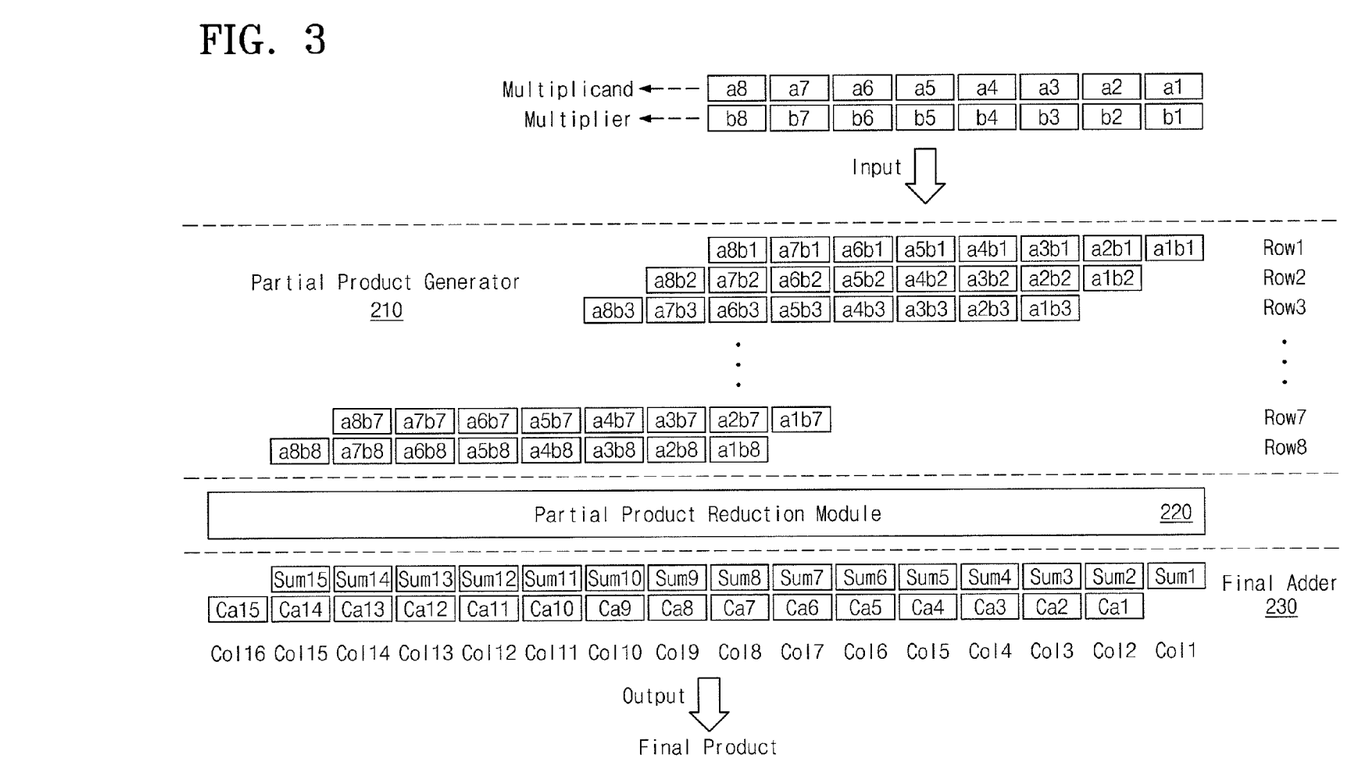
FIG. 3 illustrates an embodiment of a partial product generator and a final adder.

FIG. 3 illustrates an embodiment of a partial product generator and a final adder, which, for example, may be the ones in FIG. 2. Referring to FIG. 3, the partial product generator 210 includes logic cells a1b1 to a8b8, each of which calculates a partial product based on the multiplicand and the multiplier. The final adder 230 includes sum-bit cells Sum1 to Sum15 and carry-bit cells Ca1 to Ca15. For illustrative purposes, each of the multiplicand and the multiplier has 8 bits. However, the multiplicand and the multiplier may be more or less than 8 bits in another embodiment. The multiplicand may include a1 to a8 bits, and the multiplier may include b1 to b8 bits.

The partial product generator 210 may include an arrangement of the logic cells a1b1 to a8b8. For example, the logic cells a1b1 to a8b8 may be placed on a two-dimensional plane in the shape of a rhombus-like parallelogram. The logic cells a1b1 to a8b8 may be in rows Row1 to Row8. For example, the logic cells a1b1, a2b1, a3b1, ..., and a8b1 may be in a row Row1. The logic cells a1b1 to a8b8 may be in columns Col1 to Col16. For example, the logic cells a8b1, a7b2, a6b3, ..., and a1b8 may be in a column Col8.

The partial product reduction module 220 may accumulate the partial products and may deliver sum-bits and carry-bits into sum-bit cells Sum1 to Sum15 and carry-bit cells Ca1 to Ca15 of the final adder 230, respectively. For example, the partial product reduction module 220 may use a Wallace tree. The logic cells in the partial product reduction module 220 may have the same shape and size, or may have different sizes and shapes.

The final adder 230 may include the sum-bit cells Sum1 to Sum15 and the carry-bit cells Ca1 to Ca15. The sum-bit cells Sum1 to Sum15 may constitute a row, and the carry-bit cells Ca1 to Ca15 may constitute a row.

Logical circuitry (e.g., an SOC) may use various datapath logics. The parallel multiplier 200 may be one of the datapath logics. The logical circuitry may include a plurality of the parallel multipliers 200. Therefore, the time needed to design the logical circuitry may be shortened when the parallel multiplier 200 is placed quickly in consideration of power, performance, and space.

Figure 4:
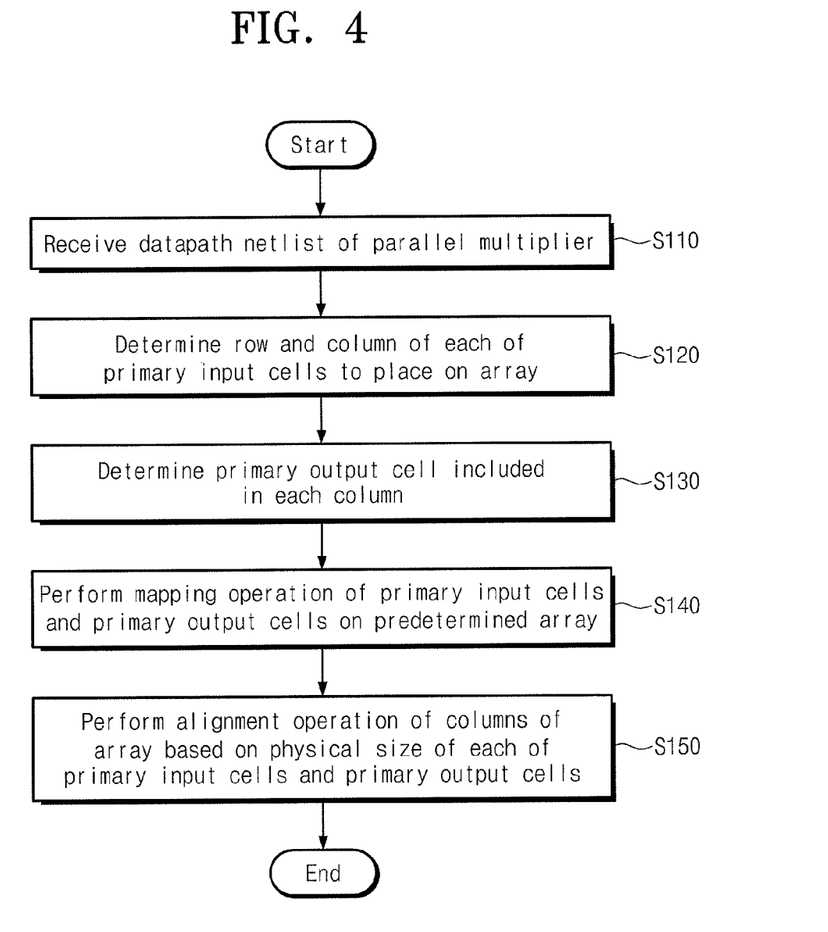
FIG. 4 illustrates an embodiment of a parallel multiplier placement method.

FIG. 4 illustrates an embodiment of a parallel multiplier placement method. Referring to FIG. 4, a parallel multiplier placement method may make it possible to place the parallel multiplier 200 quickly in a logical circuitry in consideration of power, performance, and size.

In operation S110, the parallel multiplier placement system 100 may receive a datapath netlist about the parallel multiplier 200. For example, the parallel multiplier placement system 100 may receive the netlist created by a user. Also, the parallel multiplier placement system 100 may generate the netlist with a logic synthesis tool. The logic synthesis tool may have parameters, mathematical information, and relationship information between logic cells to generate the partial product generator 210.

In operation S120, the parallel multiplier placement system 100 may determine rows and columns of primary input cells (PIs). For example, the parallel multiplier placement system 100 may define some of the logic cells a1b1 to a8b8 as the primary input cells. The primary input cell may guide structural placement of other logic cells. The primary input cell may be defined as a cell which is connected to a net of inputs of the multiplicand and the multiplier.

The primary input cell extracting method may vary, for example, according to types of the logic cells of the partial product generator 210. For example, the logic cells of the partial product generator 210 may a Booth type or a non-Booth type. For the Booth type, the primary input cell may be extracted using a net of the multiplicand. For the non-Booth type, the primary input cell may be extracted using a net of the multiplicand and the multiplier.

Locations of extracted primary input cells may be estimated. For example, rows of the primary input cells may be determined using a row inference algorithm. Referring to FIG. 3, rows of the logic cells a1b1 to a8b8 may be determined by the multiplier. For example, the logic cells, a1b1 to a8b1, of a first row Row1 may be cells multiplied by the multiplier of b1. The logic cells a1b2 to a8b2 of a second row Row2 may be cells multiplied by the multiplier of b2. The logic cells a1b3 to a8b3 of a third row Row3 may be cells multiplied by the multiplier of b3. The location of a row containing the primary input cells may be determined by a multiplier.

Furthermore, columns of the primary input cells may be determined by a column inference algorithm. The columns of the logic cells a1b1 to a8b8 may be determined by the multiplicand and the multiplier. The logic cells in the same column may have the same value that is a sum of bit positions of the multiplicand and the multiplier about each logic cell. For example, in the logic cell a1b1 of a first column Col1, a sum of bit positions of the multiplicand and the multiplier may be 2. In the logic cells a2b1 and a1b2 of a second column Col2, a sum of bit positions of the multiplicand and the multiplier may be 3. In the logic cells a3b1, a2b2, and a1b3 of a third column Col3, a sum of bit positions of the multiplicand and the multiplier may be 4. Locations of columns containing the primary input cells may be determined by the multiplicand and the multiplier.

In operation S130, the parallel multiplier placement system 100 may determine primary output cells (POs) contained in each column. The primary output cells may be determined by tracking sum-bits of a netlist. For example, outputs of the primary input cells may be connected to compress cells of the partial product reduction module 220, respectively. Each compress cell may receive a plurality of inputs to output a sum-out and a carry-out. The sum-outs may be respectively connected to the primary output cells without changing the locations of the columns Col1 to Col16. Therefore, the columns Col1 to Col16 of the primary output cells may be determined by tracking the sum-outs of the compress cells of the partial product reduction module 220 connected to the primary input cells.

In operation S140, the parallel multiplier placement system 100 may map the primary input cells and the primary output cells on an array. For example, the parallel multiplier placement system 100 may generate the array to map the primary input cells and the primary output cells. The array may have a structure of the parallel multiplier 200 logically. If the size of the array is determined such that all the logic cells are placed, an aspect ratio of the array on which the logic cells are mapped may become larger, thereby reducing a quality of result (QoR) of the parallel multiplier 200. Therefore, the parallel multiplier placement system 100 may determine the size of the array based on the number of primary input cells. For example, the parallel multiplier placement system 100 may set in advance the number of rows of the array. The parallel multiplier placement system 100 may determine the number of primary input cells to be mapped on each column using the predetermined number of rows. However, some of the primary input cells may be mis-mapped.

The parallel multiplier placement method according to one exemplary embodiment may allow mis-mapping of the primary input cells. The mis-mapping may mean that the primary input cells and the primary output cells are mapped on locations different from locations where the primary input cells and the primary output cells are extracted. The parallel multiplier placement system 100 may perform an optimization operation, in which the number of logic cells mapped is maximized while minimizing the number of mis-mapped logic cells.

Based on Min-cost Maximum flow (MCF) algorithm, the parallel multiplier placement system 100 may map the primary input cells such that a sum of differences between estimated locations and practically mapped locations of the primary input cells is minimized. However, the MCP algorithm may not consider net connections between the logic cells. Therefore, the parallel multiplier placement system 100 may use half-perimeter wire length (HPWL) algorithm for the net connections between the logic cells. The parallel multiplier placement system 100 may assign different weights to the MCF and HPWL algorithms, respectively.

In operation S150, the parallel multiplier placement system 100 may arrange the columns of the array based on the physical sizes of the primary input cells and the primary output cells. For example, the physical size of each of the primary input cells and the primary output cells may not be considered before operation S140. Here, sizes of the primary input cells and the primary output cells may be different from each other. The array mapped in operation S140 need be rearranged in the light of the physical sizes of the primary input cells and the primary output cells.

For example, the parallel multiplier placement system 100 may execute bit-slice alignment algorithm. The bit-slice alignment algorithm may control the primary input cells and the primary output cells to allow misalignment to be minimized within a predetermined limited width. The misalignment may indicate the deviation degree of each of the primary input cells and the primary output cells from the mapped columns.

The parallel multiplier placement method according to an exemplary embodiment may be described above. The parallel multiplier placement system 100 may receive the datapath netlist and may extract the primary input cells and the primary output cells. The parallel multiplier placement system 100 may map the primary input cells and the primary output cells on the array based on a placement algorithm. The parallel multiplier placement system 100 may place the primary input cells and the primary output cells and then may guide the placement of other logic cells. Therefore, it may be possible to place the parallel multiplier based on power, performance, and/or space in a short time compared to manual methods.

Figure 5:
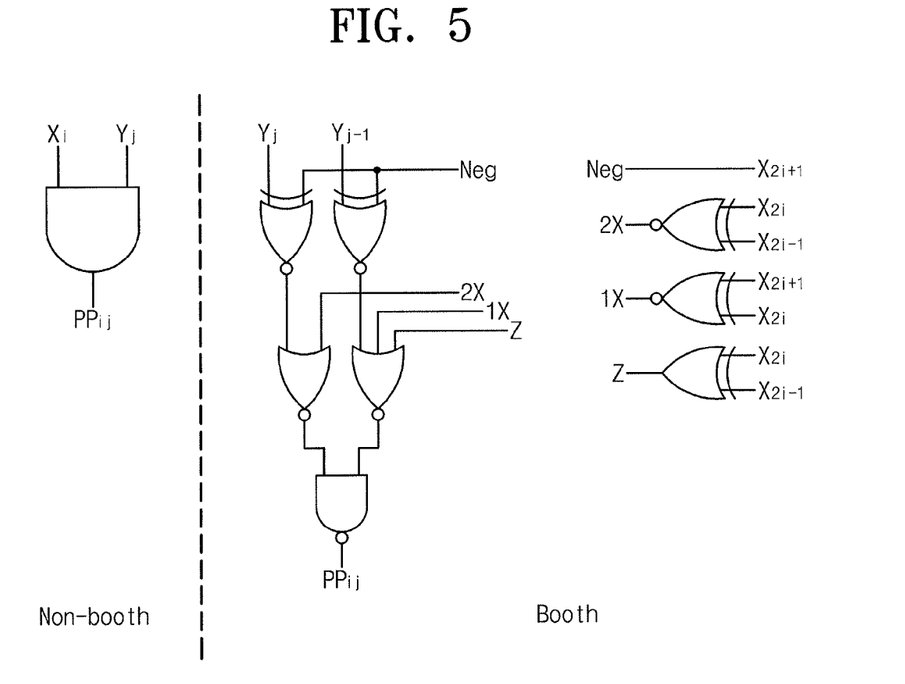
FIG. 5 illustrates an embodiment for extracting primary input cells.

FIG. 5 illustrates an embodiment of primary input cells extracted by a parallel multiplier placement system according to an exemplary embodiment. Referring to FIG. 5, each of the primary input cells may be of, but not limited to, a Booth type or non-Booth type. For example, the primary input cells may have a variety of types.

A location estimation algorithm applied to the parallel multiplier placement system 100 may be variously changed according to types of primary input cells. For example, a partial product $PP_{ij}$ of a non-Booth type primary input cell may be produced by a combination of inputs $X_i$ and $Y_j$. Here, X may be the multiplier and Y may be the multiplicand.

Also, i may represent an i-th row of partial products and j may represent a j-th column of partial products. For the non-Booth type, the rows and columns of the primary input cells may be identified easily based on the inputs $X_i$ and $Y_j$. For the Booth type of the primary input cells, a partial product $PP_{ij}$ may be produced by a combination of inputs $X_{2i-1}$, $X_{2i}$, $X_{2i+1}$, $Y_j$, and $Y_{j-1}$. For the Booth type, locations of the rows of the primary input cells may be estimated by dividing the inputs $X_{2i-1}$, $X_{2i}$, and $X_{2i+1}$ by two and then performing a floor operation.

Figure 6:
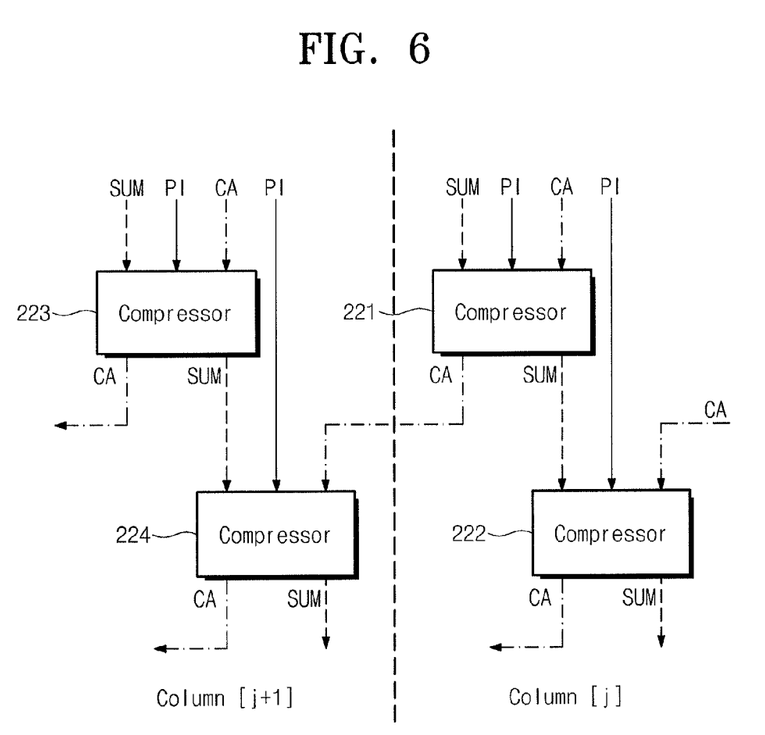
FIG. 6 illustrates an embodiment of compress cells.

FIG. 6 illustrates compress cells in a partial product reduction module according to an exemplary embodiment. Referring to FIG. 6, each of the compress cells may receive three inputs and may output two outputs. For example, the three inputs may include a sum output SUM and a carry output CA from a previous row and one of outputs from the primary input cells of the partial product generator 210. The compress cells 221 to 224 may have a different number of inputs and/or outputs in another embodiment.

In FIG. 6, the compress cells 221 and 222 may belong to the $j^{th}$ column. The compress cells 223 and 224 may belong to a $(j^{th}+1)$ column. Each sum output SUM may be transmitted through the same column without changing of a column. In contrast, for each carry output CA, a column may be changed whenever a row is changed. Therefore, the parallel multiplier placement system 100 may extract columns of the primary input cells by tracking sum outputs (or bits) SUM of the compress cells connected to the primary input cells.

Figure 7:
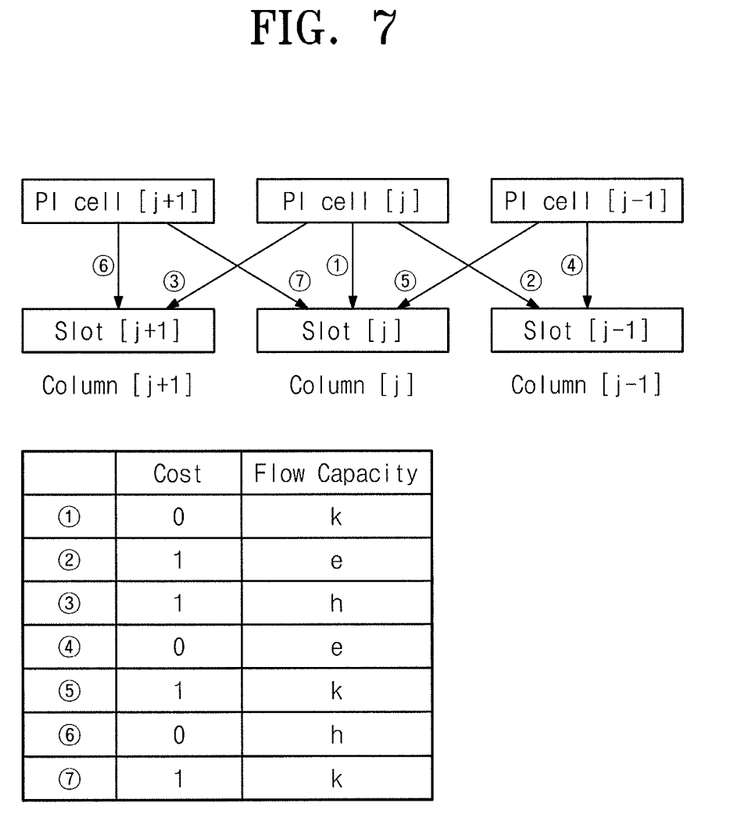
FIG. 7 illustrates an embodiment of a min-cost maximum flow (MCF) algorithm.

FIG. 7 illustrates a min-cost maximum flow (MCF) algorithm according to an exemplary embodiment. FIG. 7 shows a method of mapping a primary input cell PI cell [j]. The primary input cell PI cell [j] may be a cell estimated as belonging to a $j^{th}$ column. For example, columns Column [j+1], Column [j], and Column [j−1] may include slots Slot [j+1], Slot [j], and Slot [j−1], respectively. The primary input cell PI cell [j] may be mapped on one of the slots Slot [j+1], Slot [j], and Slot [j−1]. Therefore, the primary input cell PI cell [j] may be compared with adjacent primary input cells such as a primary input cell PI cell [j+1] and a primary input cell PI cell [j−1]. Each arrow may indicate how each of the primary input cells, the primary input cell PI cell [j+1], the primary input cell PI cell [j], and the primary input cell PI cell [j−1], is mapped on one of the slots Slot[j+1], Slot[j], and Slot[j−1]. A cost and a flow capacity may be variable according to cases ① to ⑦. Therefore, the parallel multiplier placement system 100 may map the primary input cell PI cell [j] on the array such that the cost is minimized and the flow capacity is maximized.

In FIG. 7, an embodiment is exemplified in which the MCF algorithm is used with respect to the primary input cell PI cell [j]. In another embodiment, the parallel multiplier placement system 100 may perform the MCF algorithm with respect to all the extracted primary input cells. The parallel multiplier placement system 100 may map the primary input cells on the array such that a sum of results about all the primary input cells is minimized through the MCF algorithm.

Figure 8:
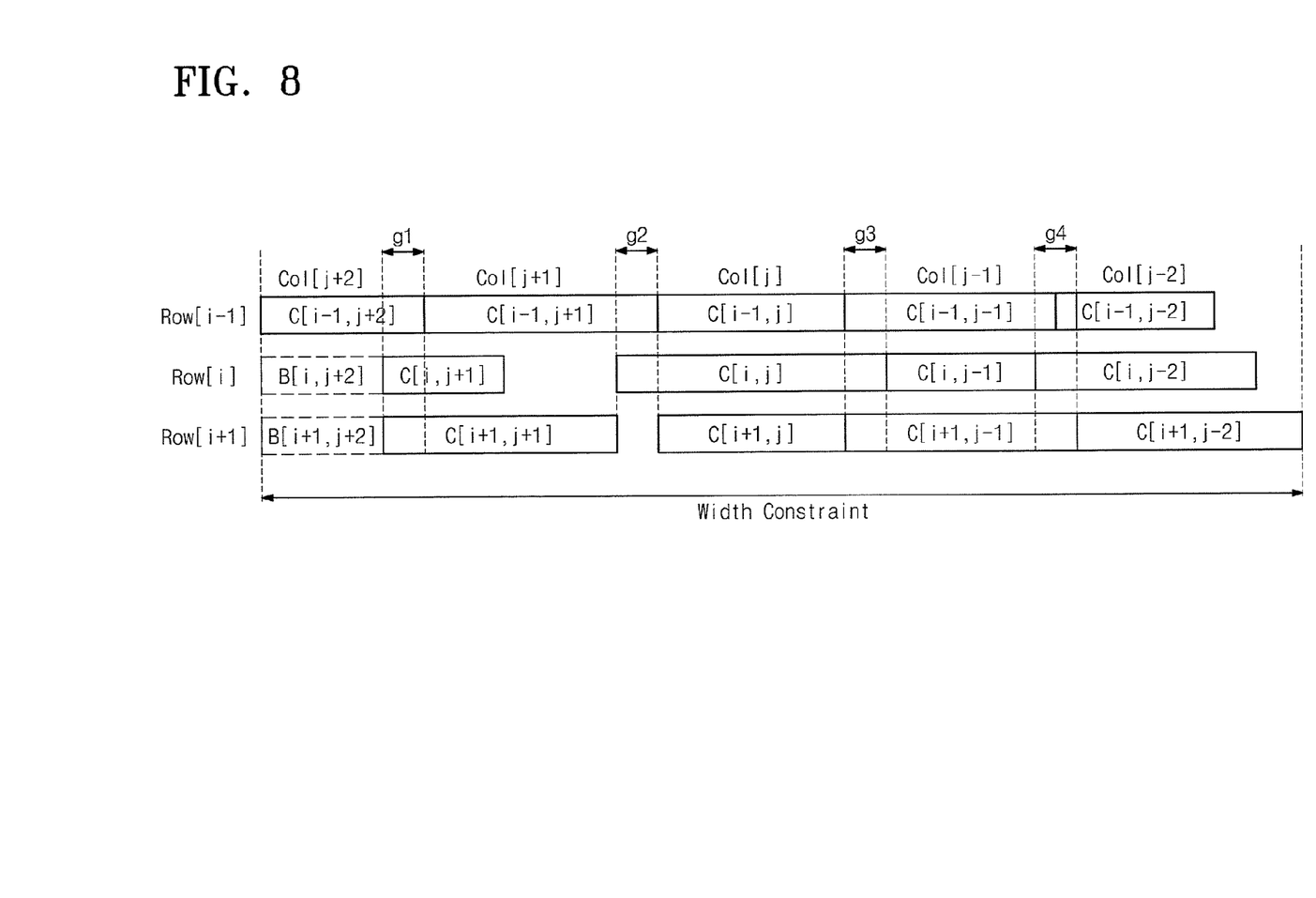
FIG. 8 illustrates an embodiment of a bit-slice alignment algorithm.

FIG. 8 illustrates an embodiment of a bit-slice alignment algorithm. According to the physical sizes of the primary input cells mapped on the array, edges of the primary input cells may be deviated from each column to the left or right. Thus, differences between the edges of cells which are the most deviated from column boundaries may be determined. For example, the maximum edge difference g1 between a column Col[j+2] and a column Col[j+1] may be determined by a cell C[i−1, j+2] and a cell C[i, j+1] or by the cell C[i−1, j+2] and a cell C[i+1, j+1]. The maximum edge difference g2 between the column Col[j+1] and a column Col[j] may be determined by a cell C[i−1, j+1] and a cell C[i, j]. The maximum edge difference of g3 between the column Col[j] and a column Col[j−1] may be determined by the cell C[i, j] and a cell C[i−1, j−1] or by the cell C[i, j] and a cell C[i+1, j−1]. The maximum edge difference of g4 between the column Col[j−1] and a column Col[j−2] may be determined by the cell C[i+1, j−1] and a cell C[i, j−2]. Empty cells such as B[i, j+2] and B[i+1, j+2] may be mapped on the slots where the primary input cells may not be mapped.

The parallel multiplier placement system 100 may adjust the locations of the primary input cells to allow the sum of the maximum edge differences g1 to g4 to be minimized in a predetermined width constraint. An embodiment is exemplified with three rows and five columns. In another embodiment, the parallel multiplier placement system 100 may execute the bit-slice alignment algorithm with respect to the primary input cells mapped in the same manner.

Figure 9:
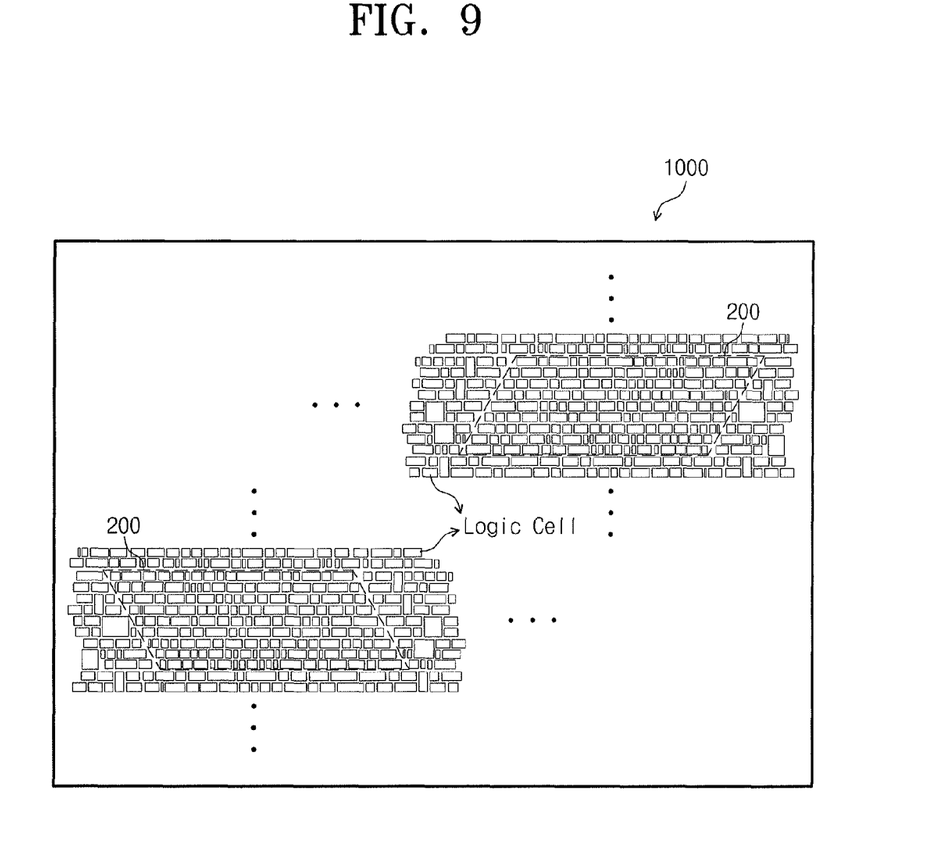
FIG. 9 illustrates an embodiment of logic circuitry including a parallel multiplier mapped using a parallel multiplier placement method.

FIG. 9 illustrates logic circuitry 1000 including a parallel multiplier mapped using a parallel multiplier placement method according to an exemplary embodiment. Referring to FIG. 9, the logic circuitry 1000 may include a plurality of logic cells. For example, the logic circuitry 1000 may include a central processing unit (CPU), a graphics process unit (GPU), a system on chip (SOC), an application processor (AP), and the like.

Prior to placing the logic cells, the parallel multipliers 200 may be placed based on embodiments of the parallel multiplier placement method described herein. After the parallel multipliers 200 are mapped, the logic cells may be placed according to their functions. Therefore, the logic cells may be quickly placed in the logic circuitry 1000 to be optimized in terms of power, performance, and space.

In accordance with one or more of the aforementioned embodiments, a partial product generator and a final adder in a parallel multiplier may be placed based on a structure that is designed to achieve an optimized or predetermined level of power, performance, and/or space. Thus, in at least one embodiment, placement of the partial product generator and final adder may be automated.

The methods, processes, algorithms, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processing units, modules, compressors, and other processing features of the embodiments disclosed herein may be implemented in logic which, for example, may include hardware, software, or both. When implemented at least partially in hardware, the controllers, processing units, modules, compressors, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processing units, modules, compressors, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments as set forth in the following claims.

What is claimed is:

1. A method, comprising:
receiving a datapath netlist about a parallel multiplier;
extracting locations of primary input cells and primary output cells from the datapath netlist using a structure analysis module, the structure analysis module to extract the primary input cells and primary output cells based on a multiplicand and a multiplier provided to the parallel multiplier;
mapping the primary input cells and the primary output cells on a specific array using a placement and routing tool;
arranging columns of the primary input cells and the primary output cells based on physical sizes of the primary input cells, the arranging being performed using the placement and routing tool, wherein a size of the specific array is determined according to a number of the primary input cells;
executing, by the primary input cells, a logical operation to generate partial products based on the multiplicand and the multiplier;
accumulating the partial products and generating sum-bits and carry-bits; and
outputting a final product by adding the sum-bits and carry-bits.

2. The method as claimed in claim 1, further comprising:
estimating rows to which the primary input cells belong using the multiplier provided to the parallel multiplier, and
estimating columns to which the primary input cells belong using the multiplicand and the multiplier provided to the parallel multiplier.

3. The method as claimed in claim 1, wherein columns to which the primary output cells belong are determined by tracking sum outputs of compress cells connected to the primary input cells.

4. The method as claimed in claim 1, wherein:
the specific array includes a plurality of slots, and
mapping the primary input cells and the primary output cells on a specific array includes mapping the primary input cells and the primary output cells on the plurality of slots so as to have a minimum cost and a maximum flow capacity when each of the primary input cells is mapped on one of the plurality of slots.

5. The method as claimed in claim 4, wherein the cost is determined based on a distance between estimated locations and practically mapped locations of the primary input cells.

6. The method as claimed in claim 4, wherein the flow capacity is variable according to the plurality of the slots.

7. The method as claimed in claim 4, wherein the flow capacity is proportional to a quantity of data which is transmitted from the primary input cells to the primary output cells.

8. The method as claimed in claim 4, wherein the placement and routing tool applies different weights to the cost and the flow capacity to map the primary input cells and the primary output cells on the specific array.

9. The method as claimed in claim 1, wherein:
arranging the columns of the primary input cells and the primary output cells includes rearranging primary input cells in a first column and a second column which are adjacent to each other such that a distance between a first edge and a second edge is minimized,
the first edge is an edge of a first cell which is a most deviated in a direction of the second column, from among the primary input cells in the first column, and
the second edge is an edge of a second cell which is a most deviated in a direction of the first column, from among the primary input cells in the second column.

10. The method as claimed in claim 1, wherein:
arranging the columns of the primary input cells and the primary output cells includes mapping an empty cell having a physical size on a slot, on which a primary input cell is not mapped, from among slots of the specific array.

11. A method, comprising:
generating a datapath netlist about a parallel multiplier through a logic synthesis tool;
inputting information about a structure of the parallel multiplier into the placement and routing tool;
extracting locations of primary input cells and primary output cells from the datapath netlist based on a multiplicand and a multiplier provided to the parallel multiplier;
mapping the primary input cells and the primary output cells on a specific array based on the information about the structure of the parallel multiplier;
arranging columns of the primary input cells and the primary output cells based on physical sizes of the primary input cells, the arranging being performed using the placement and routing tool, wherein a size of the specific array is determined according to a number of the primary input cells;
executing, by the primary input cells, a logical operation to generate partial products based on the multiplicand and the multiplier;
accumulating the partial products and generating sum-bits and carry-bits; and
outputting a final product by adding the sum-bits and carry-bits.

12. The method as claimed in claim 11, wherein mapping the primary input cells and the primary output cells is performed based on a template which includes information corresponding to connection relations and a structure of the primary input cells and the primary output cells.

13. The method as claimed in claim 11, wherein:
the primary input cells correspond to a part of logic cells of a partial product generator of the parallel multiplier, and
the primary output cells correspond to a part of logic cells of a final adder of the parallel multiplier.

14. A method, comprising:
extracting locations of input and output cells from a datapath netlist;
mapping the input cells and the output cells on an array;
arranging columns of the input cells and the output cells based on physical sizes of the input cells, wherein arranging the columns is performed using a placement and routing tool and wherein a size of the array is determined based on number of the input cells and wherein extracting the locations of the input and output cells is performed based on a multiplicand and a multiplier provided to the parallel multiplier;
executing, by the input cells, a logical operation to generate partial products based on the multiplicand and the multiplier;
accumulating the partial products and generating sum-bits and carry-bits; and
outputting a final product by adding the sum-bits and carry-bits.

15. The method as claimed in claim 14, further comprising:
estimating rows to which the input cells belong using a multiplier provided to the parallel multiplier, and
estimating columns to which the input cells belong using a multiplicand and the multiplier provided to the parallel multiplier.

* * * * *